US007229744B2

(12) United States Patent
Patel

(10) Patent No.: US 7,229,744 B2
(45) **Date of Patent: *Jun. 12, 2007**

(54) METHOD FOR PREPARING LITHOGRAPHIC PRINTING PLATES

(75) Inventor: Jayanti Patel, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 429 days.

This patent is subject to a terminal disclaimer.

(21) Appl. No.: 10/393,762

(22) Filed: Mar. 21, 2003

(65) Prior Publication Data

US 2004/0185369 A1 Sep. 23, 2004

(51) Int. Cl.
*G03F 7/20* (2006.01)
*G03F 7/26* (2006.01)

(52) U.S. Cl. ...................... 430/302; 430/309; 430/348; 430/434; 430/435; 430/494; 430/944; 430/945

(58) Field of Classification Search ............. 430/270.1, 430/271.1, 273.1, 281.1, 283.1, 302, 309, 430/348, 434, 435, 494, 944, 945
See application file for complete search history.

(56) References Cited

U.S. PATENT DOCUMENTS

| | | | | |
|---|---|---|---|---|
| 6,280,899 | B1 | 8/2001 | Parsons et al. | |
| 6,352,812 | B1 | 3/2002 | Shimazu et al. | |
| 6,358,669 | B1 | 3/2002 | Savariar-Hauck et al. | |
| 6,534,235 | B1 * | 3/2003 | Hanabata et al. | 430/191 |
| 6,555,291 | B1 * | 4/2003 | Hauck | 430/302 |
| 6,593,055 | B2 * | 7/2003 | Shimazu et al. | 430/166 |
| 6,699,636 | B2 * | 3/2004 | Savariar-Hauck | 430/270.1 |
| 6,723,490 | B2 * | 4/2004 | Patel et al. | 430/271.1 |
| 2003/0108817 | A1 * | 6/2003 | Patel et al. | 430/285.1 |
| 2004/0110090 | A1 * | 6/2004 | Patel et al. | 430/302 |

FOREIGN PATENT DOCUMENTS

| | | | |
|---|---|---|---|
| EP | 0908307 | A2 | 4/1999 |
| EP | 0908784 | A1 | 4/1999 |
| EP | 0949539 | A2 | 10/1999 |
| EP | 0949 539 | A3 | 1/2000 |
| EP | 1023994 | A1 | 8/2000 |
| EP | 0864420 | B1 | 5/2001 |
| EP | 1120246 | A2 | 8/2001 |
| EP | 0908305 | B1 | 11/2001 |
| EP | 0950518 | B1 | 1/2002 |
| EP | 0940266 | B1 | 6/2002 |
| EP | 1291172 | A2 | 3/2003 |
| EP | 0960728 | B1 | 5/2003 |
| EP | 1312483 | A2 | 5/2003 |
| EP | 1347014 | A2 | 9/2003 |
| JP | 2001-042509 | | 2/2001 |
| JP | 2001-042510 | | 2/2001 |
| WO | WO 01/96119 | A1 | 12/2001 |

OTHER PUBLICATIONS

Kodak Polychrome Graphics Mercury Processor Range, Kodak Polychrome Graphics Company Ltd., 1999.
Kodak Aqua-Image Negative Plate Processor, Eastman Kodak Company, 1991.

* cited by examiner

*Primary Examiner*—Barbara L. Gilliam
(74) *Attorney, Agent, or Firm*—J. Lanny Tucker

(57) ABSTRACT

A method for preparing lithographic printing plates is disclosed. Imaged positive-working, thermally imageable, multi-layer imageable elements useful as lithographic printing plate precursors are developed using solvent based developers. Development may be carried out by immersing the imaged imageable element in the developer.

18 Claims, No Drawings

METHOD FOR PREPARING LITHOGRAPHIC PRINTING PLATES

FIELD OF THE INVENTION

This invention relates to lithographic printing. In particular, this invention relates to methods for developing imaged positive-working, thermally imageable, multi-layer imageable elements useful as lithographic printing plate precursors using solvent based developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

If after imaging, the imaged regions (the regions struck by imaging radiation) are removed in the developing process, revealing the underlying hydrophilic surface of the substrate, the plate is called a positive-working printing plate. Conversely, if the unimaged regions (the regions not struck by the imaging radiation) are removed by the developing process and the imaged regions remain, the plate is called a negative-working plate. In each instance, the regions of the radiation-sensitive layer that remain (i.e., the image areas) repel water and accept ink, and the regions of the hydrophilic surface revealed by the developing process accept water, typically a fountain solution.

Imaging of the imageable element with ultraviolet and/or visible radiation is typically carried out through a mask, which has clear and opaque regions. Imaging takes place in the regions under the clear regions of the mask but does not occur in the regions under the opaque regions of the mask. The mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of imageable elements, which obviates the need for imaging through a negative, is becoming increasingly important in the printing industry. Multi-layer positive-working imageable elements for the preparation of lithographic printing plates have been developed for use with infrared lasers. These elements comprise at least two layers, an underlayer and an imageable layer, over a substrate with a hydrophilic surface. These elements are described, for example, in Shimazu, U.S. Pat. No. 6,294,311, and U.S. Pat. No. 6,352,812; Patel, U.S. Pat. No. 6,352,811; and Savariar-Hauck, U.S. Pat. No. 6,358,669, and U.S. Pat. No. 6,528,228; the disclosures of all of which are all incorporated herein by reference.

To obtain a printing plate with imagewise distribution of printable regions, it is necessary to remove the imaged regions of the imageable element by contacting the imaged imageable element with a suitable developer. High pH developers have been used for multi-layer positive-working imageable elements. High pH developers typically have a pH of at least about 11, more typically at least about 12, even more typically from about 12 to about 14. High pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture. Preferred hydroxides are ammonium, sodium, lithium and, especially, potassium hydroxides. The alkali metal silicate has a $SiO_2$ to $M_2O$ weight ratio of at least 0.3 (where M is the alkali metal), preferably this ratio is from 0.3 to 1.2, more preferably 0.6 to 1.1, most preferably 0.7 to 1.0. The amount of alkali metal silicate in the developer is at least 20 g $SiO_2$ per 100 g of composition and preferably from 20 to 80 g, most preferably it is from 40 to 65 g.

Because of their high pH, disposal of these developers without creating environmental problems can be difficult. In addition, these developers absorb carbon dioxide from the air causing their activity to change during use.

Spray-on processors, which rely on the force of the developer spray and the brushes and plushes to dislodge the imaged regions of the element, have typically been used. In these processors, the developer is sprayed onto the imaged imageable element, but the element is not immersed in the developer.

Thus, it is difficult to control the temperature of the developer.

Thus, a need exists for a method for preparing imaged multi-layer positive-working imageable elements that does not suffer from these disadvantages.

SUMMARY OF THE INVENTION

The invention is a method of forming an image useful as a lithographic printing plate. The method comprises the steps of:

(a) thermally imaging an imageable element and producing an imaged imageable element comprising imaged regions and unimaged regions;

(b) developing the imaged imageable element with a developer and removing the imaged regions;

in which:

the imageable element comprises, in order:

an imageable layer;

an underlayer; and a substrate;

the underlayer comprises a first polymeric material;

the imageable layer comprises a second polymeric material;

the underlayer is removable by the developer;

the imageable layer is ink receptive;

the element comprises a photothermal conversion material;

the imageable layer is not removable by the developer prior to imaging;

the developer is a solvent based developer that comprises about 0.5 wt % to about 15 wt % of an organic solvent or solvents, based on the weight of the developer; and step (b) is carried out by immersing the imaged imageable element in the developer.

The resulting imaged and developed imageable elements are useful as lithographic printing plates.

DETAILED DESCRIPTION OF THE INVENTION

Unless the context indicates otherwise, in the specification and claims, the terms first polymeric material, second polymeric material, dissolution inhibitor, phenolic polymer, organic solvent, photothermal conversion material, and similar terms include mixtures of such materials. Unless otherwise specified, all percentages are percentages by weight. "Thermal imaging" refers to imaging either by infrared radiation, such as with an infrared laser, or with a hot body, such as with a thermal head or an array of thermal heads.

Imageable Element

The imageable element is a multi-layer positive-working imageable element that comprises a substrate, an underlayer, and an imageable layer. Optionally, a barrier layer and/or an absorber layer may be between the underlayer and the imageable layer. The element may also comprise a photothermal conversion material, which may be in the imageable layer, the underlayer and/or the absorber layer.

Substrate

The substrate has at least one hydrophilic surface. It comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 μm to about 600 μm. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and imageable layer) may be coated with an antistatic agent and/or a slipping layer or matte layer to improve handling and "feel" of the imageable element.

Underlayer

The underlayer is between the hydrophilic surface of the substrate and the imageable layer. After imaging, it is removed by the developer to reveal the underlying hydrophilic surface of the substrate. It is preferably soluble in the developer to prevent sludging of the developer.

The underlayer comprises a first polymeric material. The first polymeric material is preferably soluble in the developer. In addition, the first polymeric material is preferably insoluble in the solvent used to coat the imageable layer so that the imageable layer can be coated over the underlayer without dissolving the underlayer.

Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are polyvinylacetals and copolymers that comprise N-substituted maleimides, especially N-phenylmaleimide; methacrylamides, especially methacrylamide; and acrylic and/or methacrylic acid, especially methacrylic acid. More preferably, two functional groups selected from N-substituted maleimide, methacrylamide, and acrylic and/or methacrylic acid are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the imageable layer on top of the underlayer without dissolving the underlayer. These polymeric materials are typically resistant to washes with 80 wt % diacetone alcohol/20 wt % water.

Another group of preferred polymeric materials for the first polymeric material are copolymers that comprise a monomer that has a urea bond in its side chain (i.e., a pendent urea group), such as are disclosed in Ishizuka, U.S. Pat. No. 5,731,127. These copolymers comprise about 10 to 80 wt %, preferably about 20 to 80 wt %, of one or more monomers represented by the general formula:

$$CH_2{=}C(R){-}CO_2{-}X{-}NH{-}CO{-}NH{-}Y\text{-}Z,$$

in which R is —H or —$CH_3$; X is a bivalent linking group; Y is a substituted or unsubstituted bivalent aromatic group; and Z is —OH, —COOH, or —$SO_2NH_2$.

R is preferably $—CH_3$. Preferably X is a substituted or unsubstituted alkylene group, substituted or unsubstituted phenylene [$—(C_6H_4)—$] group, or substituted or unsubstituted naphthalene [$—(C_{10}H_6)—$] group; such as $—(CH_2)_n—$, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is $—(CH_2CH_2)—$. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or $—SO_2NH_2$, preferably —OH. A preferred monomer is:

$$CH_2{=}C(CH_3){—}CO_2{—}CH_2CH_2{—}NH{—}CO{—}NH\text{-}p\text{-}C_6H_4\text{-}Z,$$

in which Z is —OH, —COOH, or $—SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the imageable layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Another group of polymeric materials that are useful in the underlayer include copolymers that comprise about 10 to 90 mol % of a sulfonamide monomer unit, especially those that comprise N-(p-aminosulfonylphenyl)-methacrylamide, N-(m-aminosulfonylphenyl)methacrylamide, N-(o-aminosulfonylphenyl)methacrylamide, and/or the corresponding acrylamide. Useful materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combination of (1) a copolymer that comprises N-substituted maleimides, especially N-phenylmaleimide; methacrylamides, especially methacrylamide; and acrylic and/or methacrylic acid, especially methacrylic acid with (2) a copolymer that comprises a urea in its side chain or with a copolymer that comprises 10 to 90 mol % of a sulfonamide monomer unit, especially one that comprises N-(p-aminosulfonylphenyl)methacrylamide, N-(m-aminosulfonylphenyl)methacrylamide, N-(o-aminosulfonylphenyl)methacrylamide, and/or the corresponding acrylamide, can be used. One or more other polymeric materials, such as novolac resins, may also be present in the combination. Preferred other polymeric materials, when present, are novolac resins.

Photothermal Conversion Material

The imageable element may comprise a photothermal conversion material. When present, the photothermal conversion material may be present in the imageable layer, the underlayer, a separate absorber layer, or a combination thereof. To minimize ablation of the imageable layer during imaging with an infrared laser, the photothermal conversion material is preferably in the underlayer and/or a separate absorber layer, and the imageable layer is preferably substantially free of photothermal conversion material. That is, the photothermal conversion material in the imageable layer, if any, should absorb less than about 10% of the imaging radiation, and the amount of imaging radiation absorbed by the imageable layer, if any, is not enough to cause ablation of the imageable layer.

Photothermal conversion materials absorb radiation and convert it to heat. Photothermal conversion materials may absorb ultraviolet, visible, and/or infrared radiation and convert it to heat. Although the novolac resin may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrilium, cyanine, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful dyes include: 2-(2-(2-phenylthio-3-((1,3-dihydro-1,3,3trimethyl-2H-indol-2-ylidene)ethylidene)-1-cyclohexen-1-yl) ethenyl)-1,3,3-trimethyl-3H-indolium chloride; 2-(2-(2-phenylsulfonyl-3-(2-(1,3-dihydro-1,3,3-trimethyl-2H-indol-2-ylidene)-ethylidene)-1-cyclohexen-1-yl)-ethenyl)-1,3,3-trimethyl-3H-indolium chloride; 2-(2-(2-thiophenyl-3-(2-(1,3-dihydro-1,3,3-trimethyl-2H-indol-2-ylidene)-ethylidene)-1-cyclohexen-1-yl)-ethenyl)-1,3,3-trimethyl-3H-indolium chloride; 2-(2-(2-thiophenyl-3-(2-(1,3-dihydro-1,3,3-trimethyl-2trimethyl-2H-indol-2-ylidene)-ethylidene)-1-cyclopenten-1-yl)-ethenyl)-1,3,3-trimethyl-3trimethyl-3H-indoliu m tosylate; 2-(2-(2-chloro-3-(2-ethyl-(3H-benzthiazole-2-ylidene)-ethylide 1-cyclohexen-1-yl)-ethenyl)-3-ethyl-benzthiazoliu m tosylate; and 2-(2-(2-chloro-3-(2-(1,3-dihydro-1,3,3-trimethyl-2H-indol-2-ylidene)-ethylidene)-1-cyclohexen-1-yl)-ethenyl)-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA- 780 (Allied Signal), SpectraIR 830A and SpectraIR 840A (Spectra Colors), and IR Dye A and IR Dye B, whose structures are shown below.

IR Dye A

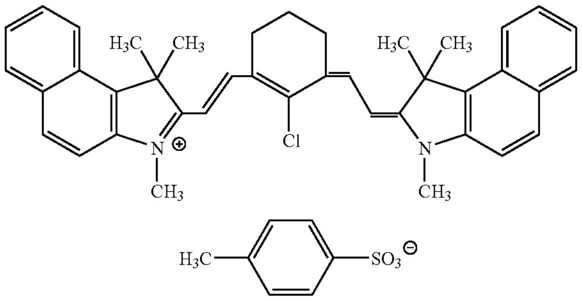

IR Dye B

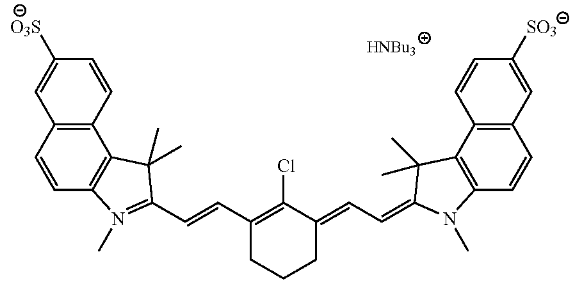

The amount of photothermal conversion material in the element is generally sufficient to provide an optical density of at least 0.05, and preferably, an optical density of from about 0.5 to about 2 at the imaging wavelength. The amount of an absorber required to produce a particular optical density can be determined from the thickness of the layer and the extinction coefficient of the absorber at the wavelength used for imaging using Beers law. Although elements that comprise a photothermal conversion material may be imaged with a thermal head, it is not necessary that the element comprise a photothermal conversion material when imaging is to be carried out with a thermal head.

Imageable Layer

The imageable layer is ink receptive and protects the underlying layer or layers from the developer. Prior to imaging, it is not removable in the developer. However, imaged regions of the imageable layer are removable by the developer after imaging. This allows the developer to penetrate the imageable layer and the underlying layer or layers and remove them in the imaged regions, revealing the underlying hydrophilic surface of the substrate.

The imageable layer comprises a second polymeric material. Polymers that contain phenolic hydroxyl groups, i.e., phenolic resins, are preferred second polymeric materials for these imageable layers. Preferably, the polymeric material is a light-stable, water-insoluble, developer-soluble, film-forming polymeric material that has a multiplicity of phenolic hydroxyl groups, either on the polymer backbone or on pendant groups. Novolac resins, resol resins, acrylic resins that contain pendent phenol groups, and polyvinyl phenol resins are preferred phenolic resins.

The second polymeric material is preferably a novolac resin, a functionalized novolac resin, or a mixture thereof. Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. Typical novolac resins include, for example, phenol-formaldehyde resins, cresol-formaldehyde resins, phenol-cresol-formaldehyde resins, p-t-butylphenol-formaldehyde resins, and pyrogallol-acetone resins.

The novolac resin is preferably solvent soluble, that is, preferably sufficiently soluble in a coating solvent to produce a coating solution that can be coated to produce an imageable layer. Common coating solvents include, for example, acetone, tetrahydrofuran, and 1-methoxypropan-2-ol. In one aspect, the second polymeric material may be selected from: solvent soluble novolac resins that have a weight average molecular weight of at least 10,000; solvent soluble novolac resins that have a weight average molecular weight of at least 10,000, functionalized with polar groups; solvent soluble m-cresol/p-cresol novolac resins that comprise at least 10 mol % p-cresol and have a weight average molecular weight of at least 8,000; solvent soluble m-cresol/p-cresol novolac resins that comprise at least 10 mol % p-cresol and have a weight average molecular weight of at least 8,000, functionalized with groups that contain the o-benzoquinonediazide or o-diazonaphthoquinone moiety; and mixtures thereof. In one aspect, the novolac resins are prepared by the solvent condensation process.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors.

A preferred group of dissolution inhibitors are triarylmethane dyes, such as ethyl violet, crystal violet, malachite green, brilliant green, Victoria blue B, Victoria blue R, Victoria blue BO, and D11 (PCAS, Longjumeau, France). These compounds can also act as contrast dyes, which distinguish the unimaged regions from the imaged regions in the developed imageable element. The dissolution inhibitor may be a monomeric and/or polymeric compound that comprises an o-diazonaphthoquinone moiety.

When a dissolution inhibitor is present in the imageable layer, it typically comprises at least about 0.1 wt %, typically about 0.5 wt % to about 30 wt %, preferably about 1 wt % to 15 wt %, based on the dry weight of the layer.

Alternatively, or additionally, the polymeric material in the imageable layer can comprise polar groups that act as acceptor sites for hydrogen bonding with the hydroxy groups present in the polymeric material and, thus, act as a both the polymeric material and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

Other Layers

Other layers may be present in the imageable elements. When present, an absorber layer is between the imageable layer and the underlayer. The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of the first polymeric material. The surfactant may be present to help disperse the photothermal conversion material in a coating solvent. When an absorber layer is present, both the imageable layer and the underlayer are substantially free of the photothermal conversion material.

The thickness of the absorber layer is generally sufficient to absorb at least 90%, preferably at least 99%, of the imaging radiation. The amount of absorber required to absorb a particular amount of radiation can be determined from the thickness of the absorber layer and the extinction coefficient of the absorber at the imaging wavelength using Beers law. Typically, the absorber layer has a coating weight of about 0.02 $g/m^2$ to about 2 $g/m^2$, preferably about 0.05 $g/m^2$ to about 1.5 $g/m^2$.

To minimize migration of the photothermal conversion material from the underlayer to the imageable layer during manufacture and storage of the imageable element, the element may comprise a barrier layer between the underlayer and the imageable layer. The barrier layer comprises a polymeric material that is soluble in the developer. If this polymeric material is different from the first polymeric material, it is preferably soluble in at least one organic solvent in which the first polymeric material is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

The first polymeric material and the polymeric material in the barrier layer may be the same polymeric material. When the barrier layer and the underlayer comprise the same polymeric material, the barrier layer should be at least half the thickness of the underlayer and more preferably as thick as the underlayer.

Preparation of the Imageable Element

The imageable element may be prepared by sequentially applying the underlayer over the hydrophilic surface of the substrate; applying the absorber layer or the barrier layer, if present, over the underlayer; and then applying the imageable layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied over the hydrophilic surface by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

If present, the absorber layer may be applied over the underlayer, typically to the surface of the underlayer, by any conventional method, such as those listed above. To prevent the underlayer from dissolving and mixing with the absorber layer when the absorber layer is coated over the underlayer, the absorber layer is preferably coated from a solvent in which the first polymeric material is essentially insoluble. Thus, if the photothermal conversion material is a dye, the coating solvent for the absorber layer should be a solvent in which the photothermal conversion material is sufficiently soluble that the absorber layer can be formed and the components of the underlayer are essentially insoluble. If the photothermal conversion material is a pigment, a dispersion of the pigment in a solvent such as water in which the components of the underlayer are essentially insoluble may be coated over the underlayer to form the absorber layer. If the photothermal conversion material is a sublimable dye, the absorber layer may be deposited by sublimation of the photothermal conversion material onto the underlayer.

The imageable layer is applied over the underlayer or, if present, over the absorber layer or barrier layer. To prevent these layers from dissolving and mixing with the imageable layer when the imageable layer is coated, the imageable layer should be coated from a solvent in which these layers are essentially insoluble. Thus, the coating solvent for the imageable layer should be a solvent in which the components of the imageable layer are sufficiently soluble that the imageable layer can be formed and in which the materials in the other layers are essentially insoluble. Typically the materials in these layers are soluble in more polar solvents and insoluble in less polar solvents so that the solvent or solvents used to coat these layers is more polar than the solvent used to coat the imageable layer. Consequently, the imageable layer can typically be coated from a conventional organic solvent such as toluene or 2-butanone. An intermediate drying step, i.e., drying the underlayer or, if present, the absorber layer, to remove coating solvent before coating the imageable layer over it, may also be used to prevent mixing of the layers. Alternatively, the underlayer, the imageable layer or both layers may be applied by conventional extrusion coating methods from a melt mixture of layer components. Typically, such a melt mixture contains no volatile organic solvents.

Imaging

Thermal direct digital imaging may be carried out by well-known methods. The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the Creo Trendsetter (Creo Products, Burnaby, BC, Canada), the Gerber Crescent 42T (Gerber, South Windsor, Conn., USA), and the Screen PlateRite 4300 and PlateRite 8600 (Screen, Rolling Meadows, Chicago, Ill., USA). Alternatively, the imageable element may be imaged using a hot body, such as a conventional apparatus containing a thermal printing head. A suitable apparatus includes at least one thermal head but would usually include a thermal head array, such as a TDK Model No. LV5416 used in thermal fax machines and sublimation printers or the GS618-400 thermal plotter (Oyo Instruments, Houston, Tex., USA).

Processing

Imaging produces an imaged element, which comprises a latent image of imaged and unimaged regions. Development of the imaged element to form an image converts the latent image to an image by removing the imaged regions, revealing the hydrophilic surface of the underlying substrate.

The developer penetrates and removes the imaged regions of the imageable layer and the underlying layer or layers without substantially affecting the complimentary unimaged regions. While not being bound by any theory or explanation, it is believed that image discrimination is based on a kinetic effect. The imaged regions of the imageable layer are removed more rapidly in the developer than the unimaged regions. Development is carried out for a long enough time to remove the imaged regions of the imageable layer, the underlying regions of the other layer or layers of the element, but not long enough to remove the unimaged regions of the imageable layer. Hence, the imageable layer is described as being “not removable” by, or “insoluble” in, the developer prior to imaging, and the imaged regions are described as being “soluble” in, or “removable” by, the developer because they are removed, and dissolved and/or dispersed, more rapidly in the developer than the unimaged regions. Typically, the underlayer is dissolved in the developer and the imageable layer is dissolved and/or dispersed in the developer.

High pH developers have been used for multi-layer positive-working imageable elements. However, it has been discovered that the imaged multi-layer positive imageable elements can be developed in a solvent based developer. Solvent based developers, also known as negative developers, have been used to develop negative-working, rather than positive-working, imageable elements.

Solvent based alkaline developers typically have a pH below about 10.5, especially below 10.2 (measured at 25° C.). Solvent based developers comprise an organic solvent or a mixture of organic solvents and are typically free of silicates, alkali metal hydroxides, and mixtures of silicates and alkali metal hydroxides. The developer is a single phase. Consequently, the organic solvent or mixture of organic solvents must be either miscible with water or sufficiently soluble in the developer that phase separation does not occur. Optional components include anionic, nonionic and amphoteric surfactants (up to 3% on the total composition weight), and biocides (antimicrobial and/or antifungal agents).

The following solvents and mixtures thereof are suitable for use in the developer: the reaction products of phenol with ethylene oxide (phenol ethoxylates) and with propylene oxide (phenol propoxylates), such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and propylene glycol with alkyl groups having six or fewer carbon atoms, such as 2-ethoxyethanol, 2-(2-ethoxy)ethoxyethanol, and 2-butoxyethanol. The developer typically comprises about 0.5 wt % to about 15 wt %, preferably about 3 wt % to about 5 wt %, of the organic solvent or solvents, based on the weight of the developer. Typical commercially available solvent based developers include: AQUA-IMAGE® Developer, PRONEG® D501 Developer, MX 1725 Developer, MX 1587 Developer, 956 Developer, 955 Developer and SP200, all available from Kodak Polychrome Graphics, Norwalk, Conn., USA.

The imaged element can be developed in an immersion processor. In an immersion processor, the imaged imageable element is immersed in developer and the developer circulated around the element. In a typical immersion processor, an imaged imageable element enters the developer in a developer tank and is immersed in the developer for a short soak period. Then a brush or plush dislodges the imaged regions of the element. Some processors have two brushes or plushes instead of one. After a short further “rinse” in the developer, the element enters a water rinse section. In a Mercury 850 processor, for example, the imaged element moves at a speed of 750 mm/min and the imaged element is in the developer for about 43 seconds, broken down as follows: 28 seconds soak, 5 seconds of brushing and immersion, and 10 seconds of developer rinse. In a typical “fast process” processor, the speed is 1500 mm/min, the element is in the developer for about 23 seconds, of which 15 seconds is the soak time. In a typical “slow” processor, the speed is 500 mm/min, and the element is in the developer for about 65 seconds, of which 42 seconds is soak time.

In contrast, in a spray-on processor, the developer is sprayed onto the imaged imageable element, but the element is not immersed in the developer. In an immersion processor, the temperature of the developer can be controlled much more precisely than in a spray-on machine.

Following development, the imaged and developed element, typically a lithographic printing plate, is rinsed with water and dried. Drying may be conveniently carried out by infrared radiators or with hot air. After drying, the element may be treated with a gumming solution. A gumming solution comprises one or more water-soluble polymers, for example polyvinylalcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

INDUSTRIAL APPLICABILITY

Images prepared by the method of the invention are useful as lithographic printing plates. Once the imageable element has been imaged and developed, printing can then be carried out by applying a fountain solution and then a lithographic ink to the image on its surface. The fountain solution is taken up by the imaged regions, i.e., the surface of the hydrophilic substrate revealed by imaging and development process, and the ink is taken up by the unimaged regions, i.e., the regions of the imageable layer not removed by the development process. The ink is then transferred to a suitable receiving material (such as cloth, paper, metal, glass or plastic) either directly or indirectly by an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

GLOSSARY

956 Developer Solvent based (phenoxyethanol) alkaline developer (Kodak Polychrome Graphics, Norwalk, Conn., USA)

BYK 307 Polyethoxylated dimethylpolysiloxane copolymer (Byk-Chemie, Wallingford, Conn., USA)

Copolymer A Copolymer of N-phenylmaleimide, methacrylamide, and methacrylic acid (40.2:34.9:24.9 mol %)

Ethyl Violet C.I. 42600; CAS 2390-59-2 ($\lambda_{max}$=596 nm) $[(p-(CH_3CH_2)_2NC_6H_4)_3C^+Cl^-]$ IR Dye A Infrared absorbing dye ($\lambda_{max}$=830 nm) (see structure above) (Eastman Kodak, Rochester, N.Y., USA)

N13 Novolac resin; 100% m-cresol; MW 13,000, manufactured by solvent condensation (Eastman Kodak Rochester, N.Y., USA)

P3000 Reaction product of 1,2-naphthoquinone-5-sulfonyl chloride with pyrogallol acetone condensate (PCAS, Longjumeau, France)

PD-140A Novolac resin (75:25 m-cresol/p-cresol); MW 1,000 (Borden Chemical, Louisville, Ky., USA)

PD-494A Novolac resin; 53% m-cresol/47% p-cresol; MW 8,000 (Borden Chemical, Louisville, Ky., USA)

Substrate A 0.3 Gauge aluminum sheet, which had been electrograined, anodized and treaded with a solution of polyvinylphosphonic acid

Examples 1–3

These examples illustrate preparation and processing of positive-working, multi-layer imageable elements.

Underlaver A coating solution containing 85 parts by weight of Copolymer A and 15 parts by weight of IR Dye A in 15:20:5:60 (w:w) butyrolactone:methyl ethyl ketone:water:1-methoxypropan-2-ol were coated onto Substrate A using a wire wound bar. The resulting element comprising the underlayer and the substrate was dried at 100° C. for 90 seconds. The coating weight of the resulting underlayer was of 1.5 g/m$^2$.

Imageable layer Coating solutions containing the ingredients shown in Table 1 in diethyl ketone were coated onto the underlayer using a wire wound bar. The resulting imageable elements were dried at 100° C. for 90 seconds. The coating weight of the resulting imageable layer was of 0.7 g/m$^2$.

TABLE 1

Imageable layers

| Component | Example # 1 | 2 | 3 |
|---|---|---|---|
| | Parts by Weight | | |
| PD140A | 69.5 | | |
| PD494A | | 69.5 | |
| N13 | | | 69.5 |
| P3000 | 30 | 30 | 30 |
| Ethyl Violet | 0.5 | 0.5 | 0.5 |

The imageable elements were imaged with 830 nm radiation using an internal test pattern on a Creo 3230 Trendsetter (118 mJ/cm$^2$, 250 rpm, and 13 W laser power). The Creo Trendsetter 3230 is a commercially available platesetter, using Procom Plus software and operating at a wavelength of 830 nm (Creo Products, Burnaby, BC, Canada).

The resulting imaged imageable elements were machine processed with 956 Developer in the indicated processors, all of which contain plush rollers. The following immersion processors were used:

KPG Mercury Mark V processor (Kodak Polychrome Graphics, Norwalk, Conn., USA)

Global Graphics Titanium processor (Global Graphics, Trenton, N.J., USA).

Glunz and Jensen Quartz 85 processor (Glunz and Jensen, Elkwood, Va., USA)

The resolution of the resulting image was measured using a Gretag MacBeth D19C densitometer (Gretag Macbeth Color Data Systems, The Wirral, UK).

TABLE 2

| Processor Type | Example | Developer Temperature (° C.) | Processing Speed (mm/min) | Plate resolution: At 175 lpi and 2400 dpi | At 200 lpi and 2400 dpi |
|---|---|---|---|---|---|
| KPG | 1 | 22.5 | 1200 | 1 to 99% | 2 to 98% |
| Mercury | 2 | 22.5 | 1200 | 1 to 99% | 2 to 98% |
| Mark V | 3 | 22.5 | 1200 | 1 to 99% | 2 to 98% |
| Global | 1 | 22.5 | 1220 | 1 to 99% | 2 to 98% |
| Graphics | 2 | 22.5 | 1220 | 1 to 99% | 2 to 98% |
| Titanium | 3 | 22.5 | 1220 | 1 to 99% | 2 to 98% |
| Glunz and | 1 | 22.8 | 1070 | 1 to 99% | 2 to 98% |
| Jensen | 2 | 22.8 | 1070 | 1 to 99% | 2 to 98% |
| Quartz 85 | 3 | 22.8 | 1070 | 1 to 99% | 2 to 98% |

Having described the invention, we now claim the following and their equivalents.

What is claimed is:

1. A method of forming an image, the method comprising the steps of:

(a) thermally imaging an imageable element and producing an imaged imageable element comprising imaged regions and unimaged regions;

(b) developing the imaged imageable element with a developer and removing the imaged regions;

in which:

the imageable element comprises, in order:

an imageable layer;
an underlayer; and
a substrate;
the underlayer comprises a first polymeric material;
the imageable layer comprises a second polymeric material;
the underlayer is removable by the developer;
the imageable layer is ink receptive;
the element comprises a photothermal conversion material;
the photothermal conversion material is in the underlayer;
the imageable layer is not removable by the developer prior to imaging;
the developer is a solvent based developer that comprises about 0.5 wt % to about 15 wt % of an organic solvent or solvents, based on the weight of the developer and is free of silicates, alkali metal hydroxides. and mixtures of silicates and alkali metal hydroxides; and
step (b) is carried out by immersing the imaged imageable element in the developer.

2. The method of claim 1 in which imaging is carried out with infrared radiation.

3. The method of claim 2 in which:
the first polymeric material is selected from the group consisting of (1) polyvinylacetals and (2) copolymers that comprise an N-substituted maleimide, a methacrylamide, acrylic acid, or methacrylic acid;
the second polymeric material is a novolac resin; and
the imageable element does not comprise an absorber layer.

4. The method of claim 3 in which the first polymeric material is a copolymer that comprises about 25 to about 75 mol % of N-phenylmaleimide, about 10 to about 50 mol % of methacrylamide, and about 5 to about 30 mol % of methacrylic acid.

5. The method of claim 3 in which the developer has a pH below 10.5.

6. The method of claim 1 in which the developer has a pH below about 10.5.

7. The method of claim 1 in which imaging is carried out with infrared radiation.

8. The method of claim 7 in which the organic solvent is selected from the group consisting of phenol ethoxylates; phenol propoxylates; benzyl alcohol; esters of ethylene glycol with acids having six or fewer carbon atoms; esters of propylene glycol with acids having six or fewer carbon atoms; ethers of ethylene glycol with alkyl groups having six or fewer carbon atoms; ethers of diethylene glycol with alkyl groups having six or fewer carbon atoms, and ethers of propylene glycol with alkyl groups having six or fewer carbon atoms.

9. The method of claim 7 in which the developer comprises about 3 wt % to about 5 wt % of the organic solvent or solvents, based on the weight of the developer.

10. The method of claim 9 in which the organic solvent is selected from the group consisting of phenoxyethanol, benzyl alcohol, 2-ethoxyethanol, 2-(2-ethoxy)ethoxyethanol, and 2-butoxyethanol.

11. The method of claim 10 in which the developer has a pH below 10.2.

12. The method of claim 11 in which the second polymeric material is a novolac resin.

13. The method of claim 1 in which the developer has a pH below 10.2.

14. The method of claim 1 in which the organic solvent is selected from the group consisting of phenol ethoxylates; phenol propoxylates; benzyl alcohol; esters of ethylene glycol with acids having six or fewer carbon atoms; esters of propylene glycol with acids having six or fewer carbon atoms; ethers of ethylene glycol with alkyl groups having six or fewer carbon atoms; ethers of diethylene glycol with alkyl groups having six or fewer carbon atoms, and ethers of propylene glycol with alkyl groups having six or fewer carbon atoms.

15. The method of claim 14 in which the developer comprises about 3 wt % to about 5 wt % of the organic solvent or solvents, based on the weight of the developer.

16. The method of claim 15 in which the organic solvent is selected from the group consisting of phenoxyethanol, benzyl alcohol, 2-ethoxyethanol, 2-(2-ethoxy)ethoxyethanol, and 2-butoxyethanol.

17. The method of claim 16 in which the first polymeric material is a copolymer that comprises about 25 to about 75 mol % of N-phenylmaleimide, about 10 to about 50 mol % of methacrylamide, and about 5 to about 30 mol % of methacrylic acid.

18. The method of claim 1 in which the developer has a pH below 10.2.

* * * * *